Nov. 14, 1967 R. J. BETZ ETAL 3,353,034
PULSE GENERATOR UTILIZING CONTROL SIGNALS TO VARY PULSE WIDTH
Filed May 26, 1965
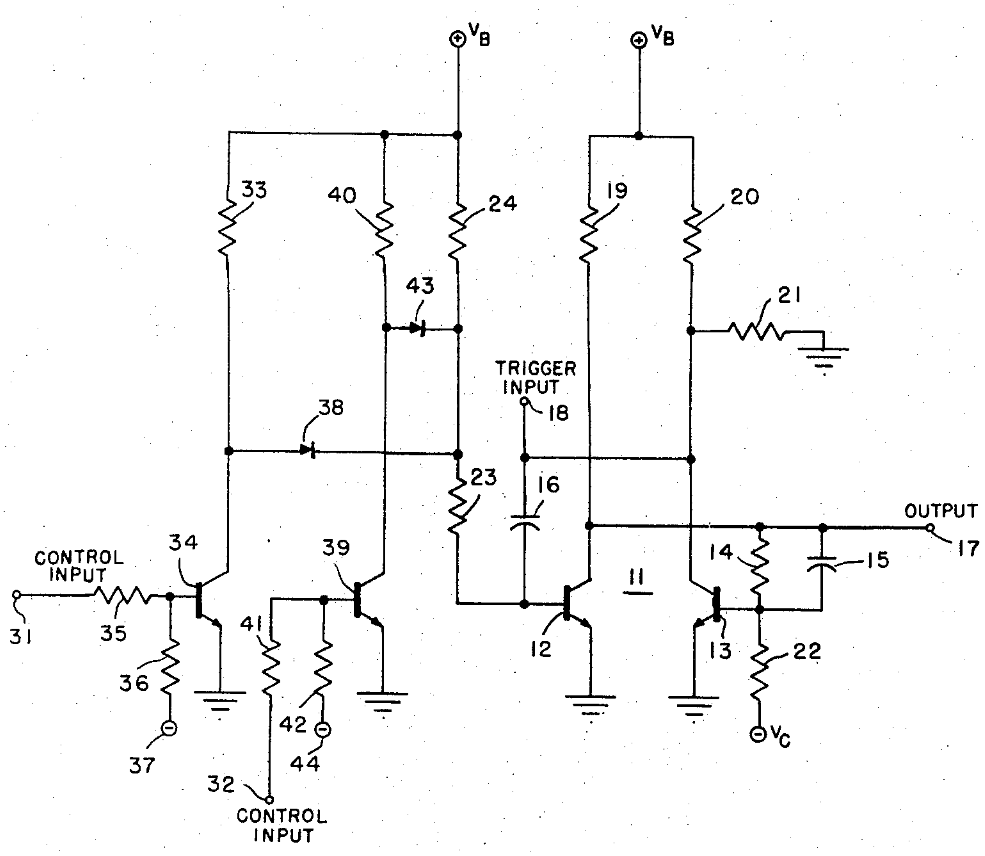
INVENTORS,
ROBERT J. BETZ
GEORGE H. MCAFEE
BY
Edward J. Kelly, Herbert Berl & Julian C. Keppler
ATTORNEYS United States Patent Office 3,353,034
Patented Nov. 14, 1967

3,353,034

PULSE GENERATOR UTILIZING CONTROL SIGNALS TO VARY PULSE WIDTH

Robert J. Betz, Ferndale, and George H. McAfee, Baltimore, Md., assignors, by mesne assignments, to the United States of America as represented by the Secretary of the Army Filed May 26, 1965, Ser. No. 459,129
3 Claims. (Cl. 307—88.5)

ABSTRACT OF THE DISCLOSURE

The pulse generator of this invention consists of a multivibrator having particular means for varying the RC time constant which determines the width of the generated pulses. Additional resistors are connected in parallel with the original time constant resistor, a diode being connected in series with each additional resistor. A transistor is connected to the junction of the additional resistor and its associated diode. Control signals are applied to the input electrodes of these transistors. In the absence of control signals the transistors are non-conducting, the diodes are forward biased, and the time constant resistance comprises all of the resistors in parallel. However, when an input control signal causes one of the transistors to conduct, its associated diode becomes back biased and its associated resistor is eliminated from the time constant network. Thus the width of the generated pulse is controlled by the particular combination of control signals simultaneously appearing at the control input terminals.

This invention relates to pulse generators and more particularly to pulse generators of the monostable multivibrator type which have associated control circuitry for controlling the output pulse width.

The width of the pulses generated by a multivibrator may be controlled by varying the RC time constant of the circuit. This can be accomplished by varying either a potentiometer or a variable capacitor associated with the multivibrator circuitry. However, these known methods cannot supply the speed and flexibility which are inherent in the present invention.

It is therefore an object of this invention to provide a pulse generator for generating pulses the width of which can be rapidly varied by the application of control signals thereto.

Another object of this invention is to provide a pulse generator having control means for changing the width of the output pulses in discrete steps.

A further object of this invention is to provide a pulse generator the output pulse width of which is dependent upon the particular combination of signals present at a plurality of control input terminals.

In the drawing the single figure is a schematic drawing of a circuit embodying the invention.

The illustrated circuit shows a pulse generator circuit 11 of the monostable multivibrator type which comprises transistors 12 and 13. The collector of transistor 12 is coupled to the base of transistor 13 by a parallel network comprising a resistor 14 and a capacitor 15. The collector of transistor 13 is coupled to the base of transistor 12 by a capacitor 16. Output pulses are taken from the collector of transistor 12 and appear at terminal 17. The input trigger pulses are applied at an input terminal 18 which is connected to the collector of transistor 13. The resistors 19, 20, 21 and 22 provide transistors 12 and 13 with proper biasing voltages.

Transistor 12 is normally conducting and is turned off by a trigger pulse which is applied to terminal 18. The RC network in the base circuit of transistor 12 determines the time required for this transistor to start conducting again. Usually this RC network comprises capacitor 16 and the resistance between the base of transistor 12 and the positive voltage source $V_B$, i.e., resistors 23 and 24. This time delay determines the output pulse width and may be calculated from the following formula:

$$T_D = RC \ln \frac{V_B + (V_1 - V_{sat})}{V_B}$$

where R is the series resistance of resistors 23 and 24, C is the capacitance of capacitor 16, $V_B$ is the positive supply voltage, $V_1$ is the collector voltage of the normally off transistor 13 and $V_{sat}$ is the saturation voltage of transistor 13.

This invention is primarily concerned with modifications to the pulse generator circuit hereinabove described whereby the width of the output pulses may be controlled by external control signals. The disclosed embodiment is capable of providing four different pulse widths, depending on the particular combination of control signals present at two control input terminals 31 and 32. One control circuit comprises a grounded emitter transistor 34 the collector of which is connected to the positive voltage source $V_B$ by a resistor 33. The base of transistor 34 is connected to the control input terminal 31 by a resistor 35 and to a negative bias source 37 by a resistor 36. A diode 38 is connected between the collector of transistor 34 and the junction between resistors 23 and 24. A second control circuit comprises a grounded emitter transistor 39 which has its collector connected to the positive voltage source $V_B$ by a resistor 40. The base of transistor 39 is connected to the control input terminal 32 by a resistor 41 and to a negative bias source 44 by a resistor 42. A diode 43 connects the collector of transistor 39 to the junction between resistors 23 and 24.

In the absence of control signals at terminals 31 and 32, transistors 34 and 39 are biased to cutoff causing a positive potential approaching the value of $V_B$ to appear at the collectors of these transistors. Diodes 38 and 43 are then forward biased, thus connecting resistors 33 and 40 in parallel with resistor 24. The charge path for capacitor 16 is then through resistor 23 and the parallel combination of resistors 24, 33 and 40. This combination of resistors lowers the time constant of the multivibrator circuit, providing a shorter time delay and therefore shorter output pulses than would occur if the two control circuits and resistors 33 and 40 were not present.

If a positive control signal is present at the control input terminal 31, transistor 34 becomes saturated, back biasing diode 38, and the charge path for capacitor 16 is now through resistor 23 and the parallel combination of resistors 24 and 40. Similarly, a positive control signal at only control input terminal 32 causes transistor 39 to saturate and diode 43 to become back biased, thereby providing a charge path for capacitor 16 through resistor 23 and the parallel combination of resistors 24 and 33. The simultaneous occurrence of positive control signals at inputs 31 and 32 will result in still another pulse width since both diodes 38 and 43 will be back biased, and the charge path for capacitor 16 is through the series combination of resistors 23 and 24.

A large number of different pulse widths may be obtained by increasing the number of control circuits and by providing various combinations of control signals. The maximum pulse width for any given value of capacitor 16 is determined by the value of this capacitor multiplied by the series combination of resistors 23 and 24. The maximum value of resistors 23 and 24 is limited by the beta of transistor 12 since the resistance must be low enough to supply ample base current to saturate this transistor. However, by changing the value of capacitor 16 a completely new range of pulse widths may be obtained. By synchronizing the control signals with the trigger pulse a pattern generator may be easily realized.

What is claimed is:

1. In a pulse generator having a time constant network for controlling the width of pulses generated thereby, said network consisting of a capacitor and resistive means connected thereto for providing a charge path for said capacitor; control means comprising: a plurality of impedance networks connected in parallel with said resistive means, each of said impedance networks consisting of a control resistor and a diode connected in series; and a plurality of switching means, one of which is connected to each of said impedance networks to switch the conduction of said diodes between states of high and low impedance so that various ones of said plurality of resistors may be selectively connected in parallel with said resistive means, thereby changing the width of said generated pulses, each of said plurality of switching means comprising a transistor having input and output electrodes, said output electrode being connected to the junction of the resistor and diode connection of the one of said plurality of impedance networks which is associated with said transistor; and a control input terminal connected to the input electrode of each of said transistors.

2. In combination with a monostable multivibrator comprising first and second amplifying stages having impedance means coupling the output of said first stage to the input of said second stage, means capacitively coupling the output of said second stage to the input of said first stage, resistive means connected to said capacitive coupling means for providing a charge path for the same, means for biasing said first stage in a normally conducting condition, and means for applying triggering pulses to said capacitive coupling means; control means for said multivibrator comprising: a plurality of impedance networks connected in parallel with said resistive means, each of said impedance networks consisting of a control resistor and a diode connected in series; and a plurality of switching means, one of which is connected to each of said impedance networks to switch the conduction of said diodes between states of high and low impedance so that various ones of said plurality of resistors may be selectively connected in parallel with said resistive means, thereby changing the width of said generated pulses, each of said plurality of switching means comprising a transistor having input and output electrodes, said output electrode being connected to the junction of the resistor and diode connection of the one of said plurality of impedance networks which is associated with said transistor; and a control input terminal connected to the input electrode of each of said transistors.

3. A monostable multivibrator comprising: a first amplifying stage having a transistor; a second amplifying stage having a transistor; means to connect the emitter electrodes of the transistors of said first and second amplifying stages to a source of reference potential; impedance means coupling the collector of the transistor of said first amplifying stage to the base of the transistor of said second amplifying stage; a capacitor connected between the collector of the transistor of said second amplifying stage and the base of the transistor of said first amplifying stage; means for biasing the transistor of said first amplifying stage in a normally conducting manner; means for applying trigger pulses to the collector of the transistor of said second amplifying stage; a source of bias voltage; a first resistor connected to the base of the transistor of said first amplifying stage; a second resistor connected between said first resistor and said source of bias voltage; the series combination of a third resistor and a diode connected in parallel with said second resistor; a control transistor having an emitter connected to a source of reference potential and a collector connected to the junction between said third resistor and said diode; and means for applying control signals to the base of said control transistor.

References Cited

UNITED STATES PATENTS 3,263,223 7/1966 Zenzefilis ---------- 307—88.5

ARTHUR GAUSS, *Primary Examiner.*

J. ZAZWORSKY, *Assistant Examiner.*